US009171609B2

United States Patent
Tong et al.

(10) Patent No.: US 9,171,609 B2
(45) Date of Patent: Oct. 27, 2015

(54) ADDRESS TRANSITION DETECTING CIRCUIT

(71) Applicant: Integrated Silicon Solution (Shanghai), Inc., Shanghai (CN)

(72) Inventors: Mingzhao Tong, Shanghai (CN); Seong Jun Jang, Shanghai (CN)

(73) Assignee: INTEGRATED SILICON SOLUTION (SHANGHAI), INC., Pudong New Area, Shanghai (CN)

( * ) Notice: Subject to any disclaimer, the term of this patent is extended or adjusted under 35 U.S.C. 154(b) by 0 days.

(21) Appl. No.: 14/096,023

(22) Filed: Dec. 4, 2013

(65) Prior Publication Data

US 2015/0155032 A1    Jun. 4, 2015

(51) Int. Cl.
*G11C 11/418*    (2006.01)

(52) U.S. Cl.
CPC ..................... *G11C 11/418* (2013.01)

(58) Field of Classification Search
CPC ...................................................... G11C 11/418
See application file for complete search history.

(56) References Cited

U.S. PATENT DOCUMENTS

| 5,646,565 A * | 7/1997 | Tukidate ........................ 327/174 |
| 6,018,256 A * | 1/2000 | Kumagai et al. .............. 327/112 |
| 6,643,205 B2 * | 11/2003 | Kim ............................... 365/222 |
| 7,428,186 B2 * | 9/2008 | Lee ............................. 365/233.5 |
| 8,643,420 B2 * | 2/2014 | Kim et al. ..................... 327/172 |
| 8,810,279 B2 * | 8/2014 | Shim et al. ...................... 326/93 |

FOREIGN PATENT DOCUMENTS

CN    102820045 A    * 12/2012

* cited by examiner

*Primary Examiner* — Harry W Byrne
*Assistant Examiner* — Lance Reidlinger
(74) *Attorney, Agent, or Firm* — Jun He Law Offices P.C.; Zhaohui Wang

(57) ABSTRACT

The address transition detecting circuit includes two identical address transition detecting signal generating module, an inverter and a signal combining module. Both of the two address transition detecting signal generating modules have a unilateral delay circuit for generating an output pulse at the rising edge of the address signal and an output pulse at the falling edge of the address signal. The address transition detecting signal generating module can control the width of the two output pulses by controlling the delay times of the corresponding unilateral delay circuit. The signal combining module outputs the ATD signal having pulses at both the rising edge and falling edge of the address signal. The present application uses two unilateral delay circuits to control the width of the ATD signal at the rising edge and the falling edge of the address signal, thereby significantly preventing the width of the ATD signal from influence of the burr on the address line.

10 Claims, 8 Drawing Sheets

ADDRESS TRANSITION DETECTING CIRCUIT

FIELD OF THE INVENTION

The present application relates to an asynchronous circuit system, particularly an address transition detecting circuit.

BACKGROUND OF THE INVENTION

During the operation of an asynchronous circuit system, especially an Asynchronous SRAM ("ASRAM"), a change on the address line indicates the beginning of a new write or read cycle. Although the ASRAM does not have an external clock, a signal similar to the clock is required to trigger some internal circuits to get ready for the write and read operation, such as pre-charging a bit-line or generating a pulse word-line, etc. An Address Transition Detecting ("ATD") circuit is used to detect the change on the address line, and to generate a pulse signal for the internal circuits, and the pulse width is an important parameter for the pulse signal. The result of an over-wide pulse is that, the pre-charging of the bit-line still haven't finished when the address decoding has already finished and the word-line is ready for connection, which leads to the delay of the write or read operation. A too narrow pulse will result in insufficient pre-charging of the bit-line, which leads to the delay of the write cycle. Specially, the narrow pulse may lead to failure of the read operation in case of a pulse word-line.

FIGS. 1A and 1B show two known ATD circuits, both of which can detect the rising edge and the falling edge on the address line simultaneously.

As shown in FIG. 1A, the first known ATD circuit comprises a delay circuit 11, three NAND gates 12, 13 and 14, and an inverter 15. An input signal coupled to the input node of the delay circuit 11 is an address signal A1, and the output signals of the delay circuit 11 are signal A1D and signal A1BD. The signal A1D is a delay signal of the address signal A1, which has a delay at the rising edge and falling edge of the address signal A1. The signal A1BD is the inverting signal of the signal A1D. Two input nodes of the first NAND gate 12 are coupled to the address signal A1 and the signal A1 BD, respectively, and an output node of the first NAND gate 12 outputs a pulse signal ATD1BR at the rising edge of the address signal A1. The address signal A1 is coupled to the inverter 15, and two input nodes of the second NAND gate 13 are coupled to the signal A1D and the signal A1B at an output node of the inverter 15, wherein the signal A1B is the inverting signal of the address signal A1. The output node of the second NAND gate 13 outputs a pulse signal ATD1BF at the falling edge of the address signal A1. Two input nodes of the third NAND gate 14 are coupled to the pulse signal ATD1BR and the pulse signal ATD1BF, respectively, and an output node of the third NAND gate 14 outputs a pulse signal ATD1, which has pulses at the rising edge and the falling edge of the address signal A1.

As shown in FIG. 1B, the second known circuit comprises a delay circuit 21, two CMOS transfer gates 22 and 23, and two inverters 24 and 25. An input signal coupled to an input node of the delay circuit 21 is an address signal A2, and output signals of the delay circuit 21 include signal A2D and signal A2BD. The signal A2D is a delay signal of the address signal A2, which has a delay at the rising edge and falling edge of the address signal A2. The signal A2BD is the inverting signal of the signal A2D. The address signal A2 is coupled to the first inverter 25, and an output node of the first inverter 25 outputs signal A2B, which is the inverting signal of the address signal A2. An input node of the first CMOS transfer gate 22 is coupled to the address signal A2, and an input node of the second CMOS transfer gate 23 is coupled to the signal A2B. The signal A2D is coupled to the gate of an NMOS transistor of the first CMOS transfer gate 22, and the signal A2BD is coupled to the gate of a PMOS transistor of the first CMOS transfer gate 22 and the gate of an NMOS transistor of the second CMOS transfer gate 23. Output nodes of the first CMOS transfer gate 22 and the second CMOS transfer gate 23 output a pulse signal ATD2B, which is coupled to the second inverter 24. An output node of the second inverter 24 outputs a pulse signal ATD2, which has pulses at the rising edge and the falling edge of the address signal A2.

The delay circuits 11 in the first known ATD circuit and the delay circuit 21 in the second known ATD circuit can be implemented by various circuits. FIG. 2A shows an example of a known delay circuit, which comprises six inverters 31, four resistors 32 and four capacitors 33. Four delay modules, each of which comprises one resistor 32 and one capacitor 33, are serially coupled between the first five inverters 31 respectively. An input node of the first inverter 31 is coupled to an input signal IN, an output node of the fifth inverter 31 outputs an output signal OUT0, and an output node of the sixth inverter 31 outputs an output signal OUT1. The first and the third capacitor 33 are coupled to a negative power supply VSS or coupled to ground, and the second and the fourth capacitors 33 are coupled to a positive power supply VCC. FIG. 2B shows the waveforms of the input signal and output signals of the known delay circuit. As shown in FIG. 2B, both of the output signals OUT0 and OUT1 have corresponding delays at the rising edge and the falling edge of the input signal IN, wherein the delay time at the rising edge is DLY-R and the delay time at the falling edge is DLY-F. The delay time DLY-R is close to the delay time DLY-F such that a pulse width of the ATD signal, when the rising edge of the address signal A2 is detected, is equal to a pulse width of the ATD signal when the falling edge of the address signal A2 is detected.

FIGS. 3A and 3B show the waveforms of signals of the first and the second known ATD circuits under normal conditions, respectively. During normal operation, an interval PW_ADD between two neighboring address should be one cycle of a write or read operation (tCYC). That is to say, the interval PW_ADD is equal to tCYC, which is bigger than the width of the ATD signal, i.e. DLY_R or DLY_F. The ATD signal in FIG. 3A is the pulse signal ATD1, which has a width of DLY_R at the rising edge of the address signal A1, and a width of DLY_F at the falling edge of the address signal A1. The ATD signal in FIG. 3B is the pulse signal ATD2, which has a width of DLY_R at the rising edge of the address signal A2, and a width of DLY_F at the falling edge of the address signal A2.

If there are some burrs on the address line due to noises, the interval PW_ADD between two neighboring addresses on the address line will be smaller. The width of the burrs is generally small, and therefore the pulse width of the generated ATD signal directly depends on the width of the burrs and is irrelevant to the width DLY_R or DLY_F, as long as the width of the burrs makes the interval PW_ADD smaller than the width DLY_R or DLY_F. FIGS. 3C and 3D show the waveforms of signals of the first and the second known ATD circuits respectively under the condition that burrs exist. As shown in FIGS. 3C and 3D, the widths of the pulse signal ATD1 at the rising edge and falling edge of the address signal A1 are equal to the width of the burrs, namely equal to the width of PW_ADD, which is smaller than the width of the PW_ADD under normal conditions. The widths of the pulse signal ATD2 at the rising edge and the falling edge of the address signal AD2 are equal to the width of the burrs, namely equal to the width of PW_ADD, which is smaller than the width under normal conditions. As described above, a very narrow width of the ATD signal is dangerous, which may result in failure of the read or write operation.

SUMMARY OF THE INVENTION

The technical problem to be solved by the present application is to provide an address transition detecting circuit, which is capable of controlling the width of an ATD signal at the rising edge and falling edge of an address signal, thereby effectively prevent the width of the ATD signal from being controlled by the burr on the address line.

To solve the aforementioned technical problem, there is provided an address transition detecting circuit in the present application. The circuit comprises a first address transition detecting signal generating module, a second address transition detecting signal generating module, an inverter and a signal combining module. The first address transition detecting signal generating module is identical to the second address transition detecting signal generating module; an input node of the first address transition detecting signal generating module is coupled to an address signal; an input node of the second address transition detecting signal generating module is coupled to an inverting signal of the address signal, the inverting signal is outputted at an output node of the inverter, and an input node of the inverter is coupled to the address signal. The first address transition detecting signal generating module and the second address transition detecting signal generating module generate an output pulse at the rising edge of their corresponding input signals, and do not generate the output pulse at the falling edge of their corresponding input signals; or the first address transition detecting signal generating module and the second address transition detecting signal generating module generate the output pulse at the falling edge of their corresponding input signals, and do not generate the output pulse at the rising edge of their corresponding input signals. Input nodes of the signal combining module are coupled to an output node of the first address transition detecting signal generating module and an output node of the second address transition detecting signal generating module, the signal combining module combines the output pulse of the first address transition detecting signal generating module and the output pulse of the second address transition detecting signal generating module and outputs a combined signal, such that the signal combining module generates output pulses at its output node at both the rising edge and the falling edge of the address signal. The output pulse of the first address transition detecting signal generating module is a first signal transition detecting signal, the output pulse of the second address transition detecting signal generating module is a second signal transition detecting signal, and the output pulse of the signal combining module is a third signal transition detecting signal.

In certain embodiments, both of the first address transition detecting signal generating module and the second address transition detecting signal generating module comprise a first unilateral delay circuit and a NAND gate; a first input node of the NAND gate serves as an input node of the first or second address transition detecting signal generating module, and the first input node of the NAND gate is further coupled to an input node of the first unilateral delay circuit; a second input node of the NAND gate is coupled to an output node of the first unilateral delay circuit; an output node of the NAND gate serves as an output node of the first or second address transition detecting signal generating module. An output signal of the first unilateral delay circuit is a delay signal of the inverting signal of an input signal of the first unilateral delay circuit; the output signal of the first unilateral delay circuit is only delayed at the rising edge of the input signal of the first unilateral delay circuit, and a delay of the output signal at the falling edge of the input signal of the first unilateral delay circuit is a minimum eigenvalue; the width of the output pulse at the output node of the NAND gate is determined by the delay time of the first unilateral delay circuit to the input signal of the first unilateral delay circuit.

In certain embodiments, the first unilateral delay circuit comprises: N first CMOS inverting delay circuits, N second CMOS inverting delay circuits and an inverter, wherein N is an even number. Each of the first CMOS inverting delay circuits comprises a first PMOS transistor and a plurality of serially coupled first NMOS transistors; a source of the first PMOS transistor is coupled to a positive power supply, a gate of the first PMOS transistor is coupled to gates of the plurality of first NMOS transistors, the plurality of first NMOS transistors are serially coupled between a drain of the first PMOS transistor and a negative power supply; the plurality of first NMOS transistors are serially coupled in the following way: the drain of the first one of the plurality of first NMOS transistors is coupled to the drain of the first PMOS transistor, the drains of the others of the plurality of first NMOS transistors are coupled to the corresponding sources of their previous first NMOS transistors, and the source of the last one of the plurality of first NMOS transistors is coupled to the negative power supply or coupled to ground; the gate of the first PMOS transistor serves as an input node of the first CMOS inverting delay circuit, and the drain of the first PMOS transistor serves as an output node of the first CMOS inverting delay circuit. Each of the second CMOS inverting delay circuits comprises a plurality of serially coupled second PMOS transistors and a second NMOS transistor. A source of the second NMOS transistor is coupled to the negative power supply. A gate of the second NMOS transistor is coupled to gates of the plurality of second PMOS transistors. The plurality of second PMOS transistors are serially coupled between a drain of the second NMOS transistor and the positive power supply. The plurality of second PMOS transistors are serially coupled in the following way: the drain of the first one of the plurality of second PMOS transistors is coupled to the drain of the second NMOS transistor, the drains of the others of the plurality of second PMOS transistors are coupled to the corresponding sources of their previous second PMOS transistors, and the source of the last one of the plurality of second PMOS transistors is coupled to the positive power supply; the gate of the second NMOS transistor serves as an input node of the second CMOS inverting delay circuit, and the drain of the second NMOS transistor serves as an output node of the second CMOS inverting delay circuit. The N first CMOS inverting delay circuits and the N second CMOS inverting delay circuits are serially coupled between an input signal of the first unilateral delay circuit and an input node of the inverter alternately, wherein an input node of the first one of the first CMOS inverting delay circuits is coupled to the input signal. Input nodes of the others of the first CMOS inverting delay circuits are coupled to the corresponding output nodes of the previous second CMOS inverting delay circuits, and the output node of the Nth one of the second CMOS inverting delay circuits is coupled to the input node of the inverter. The output nodes of the first CMOS inverting delay circuits are coupled to the corresponding input nodes of the subsequent second CMOS inverting delay circuits, and the inverter outputs an output signal of the first unilateral delay circuit at its output node.

In certain embodiments, the first unilateral delay circuit comprises: N third CMOS inverting delay circuits, N fourth CMOS inverting delay circuits and an inverter, wherein N is an even number. Each of the third CMOS inverting delay circuits comprises a third PMOS transistor, a third NMOS transistor and a third resistor; a source of the third PMOS transistor is coupled to a positive power supply, a gate of the third PMOS transistor is coupled to a gate of the third NMOS transistor, a source of the third NMOS transistor is coupled to a negative power supply, and the third resistor is serially coupled between a drain of the third NMOS transistor and a drain of the third PMOS transistor; the gate of the third PMOS transistor serves as an input node of the third CMOS inverting delay circuit, and the drain of the third PMOS transistor serves as an output node of the third CMOS inverting delay circuit. Each of the fourth CMOS inverting delay circuits comprises a fourth PMOS transistor, a fourth NMOS transistor and a fourth resistor; a source of the fourth PMOS transistor is coupled to the positive power supply, a gate of the fourth PMOS transistor is coupled to a gate of the fourth NMOS transistor, a source of the fourth NMOS transistor is coupled to the negative power supply, and the fourth resistor is serially coupled between a drain of the fourth NMOS transistor and a drain of the fourth PMOS transistor; the gate of the fourth NMOS transistor is configured as the input node of the fourth CMOS inverting delay circuit, and the drain of the fourth NMOS transistor serves as an output node of the fourth CMOS inverting delay circuit. The N third CMOS inverting delay circuits and the N fourth CMOS inverting delay circuits are serially coupled between the input signal of the first unilateral delay circuit and an input node of the inverter alternately, wherein an input node of the first one of the third CMOS inverting delay circuits is coupled to the input signal, input nodes of the others of the third CMOS inverting delay circuits are coupled to corresponding output nodes of the previous fourth CMOS inverting delay circuits, an output node of the Nth one of the N fourth CMOS inverting delay circuits is coupled to an input node of the inverter, the output nodes of the third CMOS inverting delay circuits are coupled to the corresponding input nodes of the subsequent second CMOS inverting delay circuits, and the inverter outputs an output signal of the first unilateral delay circuit at its output node.

In certain embodiments, the first unilateral delay circuit comprises a NAND gate and a delay circuit, an input node of the delay circuit is coupled to the input signal, two input nodes of the NAND gate are coupled to an input signal of the first unilateral delay circuit and an output node of the delay circuit, respectively, and the NAND gate outputs an output signal of the first unilateral delay circuit at its output node. The output signal of the delay circuit has a delay at the rising edge and falling edge of the input signal.

In certain embodiments, the signal combining module is a NAND gate.

In certain embodiments, both of the first address transition detecting signal generating module and the second address transition detecting signal generating module comprise a second unilateral delay circuit and a NOR gate; a first input node of the NOR gate serves as an input node of the first or second address transition detecting signal generating module, the first input node of the NOR gate is further coupled to an input node of the second unilateral delay circuit; a second input node of the NOR gate is coupled to an output node of the second unilateral delay circuit, and an output node of the NOR gate serves as an output node of the first or second address transition detecting signal generating module. An output signal of the second unilateral delay circuit is a delay signal of the inverting signal of the input signal of the second unilateral delay circuit; the output signal of the second unilateral delay circuit is only delayed at the falling edge of the input signal of the second unilateral delay circuit, and a delay of the output signal at the rising edge of the input signal of the second unilateral delay circuit is a minimum eigenvalue. The width of the output pulse at the output node of the NOR gate is determined by the delay time of the second unilateral delay circuit to the input signal of the second unilateral delay circuit. The signal combining module is a NOR gate.

The present application uses two unilateral delay circuits to control the width of the ATD signal at the rising edge and falling edge of the address signal, i.e. the width of the third address transition detecting signal, thereby significantly preventing the width of the ATD signal from being controlled by the burrs on the address line. In this way, the width of the ATD signal can be kept stable to avoid occurrence of a narrow width of the ATD signal. Therefore, the ASRAM can be sufficiently pre-charged, the speed of the read operation can be improved and the failure of the read operation can be prevented.

BRIEF DESCRIPTION OF DRAWINGS

The present application will be further elaborated with reference to the accompanying drawings and the detailed description of the embodiments.

DETAILED DESCRIPTION OF THE INVENTION

Figure 4:
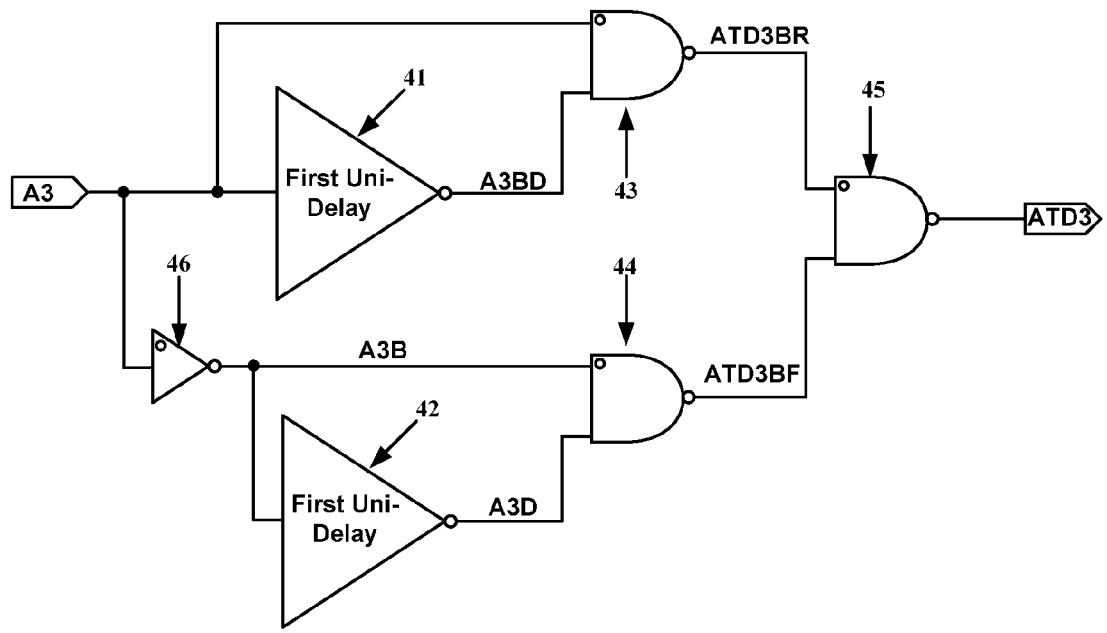
FIG. 4 shows a schematic of an ATD circuit according to a first embodiment of the invention.

FIG. 4 shows a schematic of an ATD circuit according to a first embodiment of the present application. The address transition detecting circuit according to the first embodiment of the present application comprises a first address transition detecting signal generating module, a second address transition detecting signal generating module, an inverter 46 and a signal combining module comprised of a third NAND gate 45. The first address transition detecting signal generating module is identical to the second address transition detecting signal generating module, wherein the first address transition detecting signal generating module comprises a first unilateral delay circuit 41 and a first NAND gate 43, and the second address transition detecting signal generating module comprises another first unilateral delay circuit 42 and a second NAND gate 44.

An input node of the first address transition detecting signal generating module is coupled to an address signal A3. An input node of the second address transition detecting signal generating module is coupled to an inverting signal A3B of the address signal A3, the inverting signal A3B is outputted at an output node of the inverter 46, and an input node of the inverter 46 is coupled to the address signal A3.

With respect to the first address transition detecting signal generating module, a first input node of the first NAND gate 43 serves as an input node of the first address transition detecting signal generating module, i.e. coupled to the address signal A3, and the first input node of the first NAND gate 43 is further coupled to an input node of the first unilateral delay circuit 41. A second input node of the first NAND gate 43 is coupled to an output node of the first unilateral delay circuit 41, and an output signal of the first unilateral delay circuit 41 is a signal A3BD. An output node of the first NAND gate 43 serves as an output node of the first address transition detecting signal generating module, i.e. for outputting a first address transition detecting signal ATD3BR. The output signal of the first unilateral delay circuit 41, i.e. the signal A3BD, is a delay signal of the inverting signal of the input signal, i.e. the address signal A3; and the output signal A3BD is only delayed at the rising edge of the address signal A3, and the delay of the output signal A3BD at the falling edge of the input signal A3 is a minimum eigenvalue. The term "minimum eigenvalue" means the minimum transition delay of the signal, which is caused by the parasite capacitor, resistor or the like in the circuit. The first address transition detecting signal generating module generates an output pulse at the rising edge of the address signal A3, and does not generate an output pulse at the falling edge of the address signal A3. The output pulse of the first address transition detecting signal generating module is the first address transition detecting signal ATD3BR. The width of the output pulse of the first address transition detecting signal ATD3BR is determined by the delay time of the first unilateral delay circuit 41 to its input signal.

With respect to the second address transition detecting signal generating module, a first input node of the second NAND gate 44 serves as an input node of the second address transition detecting signal generating module, i.e. coupled to the inverting signal A3B of the address signal A3, and the first input node of the second NAND gate 44 is further coupled to an input node of the first unilateral delay circuit 42. A second input node of the second NAND gate 44 is coupled to an output node of the first unilateral delay circuit 42, and an output signal of the first unilateral delay circuit 42 is a signal A3D. An output node of the second NAND gate 44 serves as an output node of the second address transition detecting signal generating module, i.e. for outputting a second address transition detecting signal ATD3BF. The output signal of the first unilateral delay circuit 42, i.e. the signal A3D, is a delay signal of the inverting signal of the input signal, i.e. the inverting signal A3B of the address signal A3; and the output signal A3D is only delayed at the rising edge of the inverting signal A3B, and a delay of the output signal A3D at the falling edge of the input signal A3B is a minimum eigenvalue. In other words, the output signal A3D is only delayed at the falling edge of the address signal A3, and the delay of the output signal A3D at the rising edge of the address signal A3 is the minimum eigenvalue. The second address transition detecting signal generating module generates an output pulse at the falling edge of the address signal A3, and does not generate the output pulse at the rising edge of the address signal A3. The output pulse of the second address transition detecting signal generating module is the second address transition detecting signal ATD3BF. The width of the second address transition detecting signal ATD3BF is determined by the delay time of the first unilateral delay circuit 42 to its input signal.

The input nodes of the third NAND gate 45 are coupled to the first address transition detecting signal ATD3BR and the second address transition detecting signal ATD3BF, respectively. The third NAND gate 45 outputs a third address transition detecting signal ATD3 at its output node, which is a combined signal of the first address transition detecting signal ATD3BR and the second address transition detecting signal ATD3BF. The third address transition detecting signal ATD3 comprises a pulse at the rising edge of the address signal A3 having the same width with the pulse of the first address transition detecting signal ATD3BR, and another pulse at the falling edge of the address signal A3 having the same width with the pulse of the second address transition detecting signal ATD3BF.

Figure 5A:
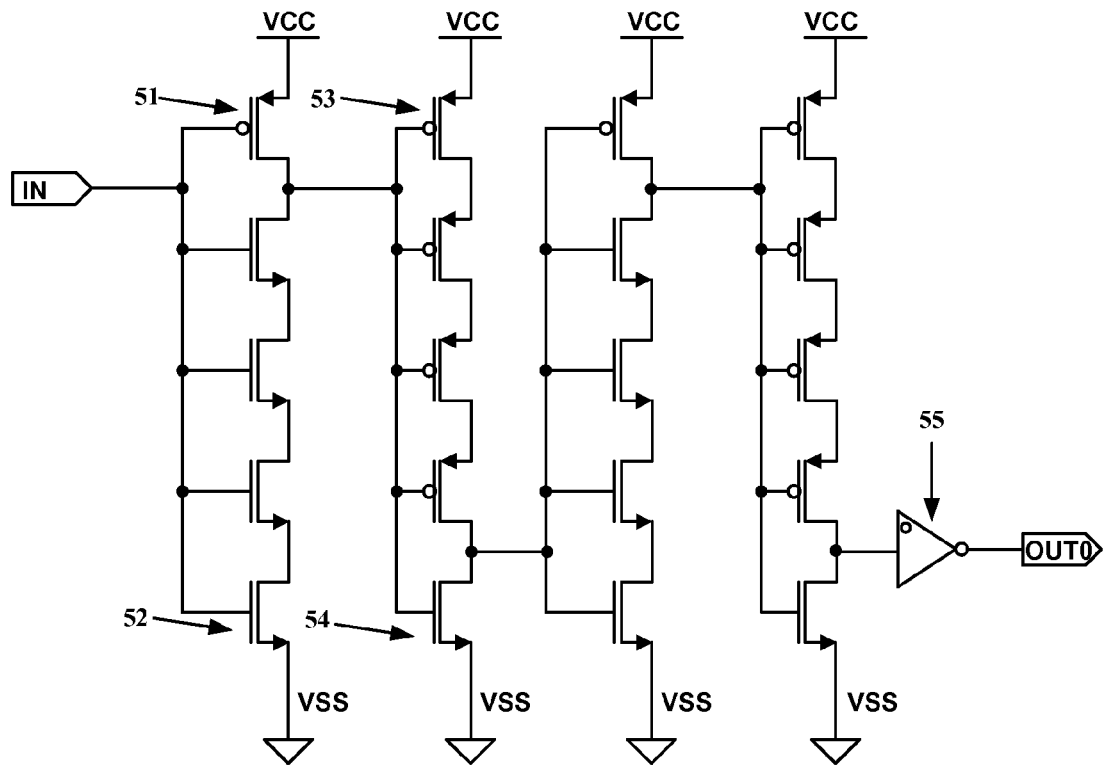
FIG. 5A shows a schematic of a first type of a first unilateral delay circuit according to a first embodiment of the present application.

FIG. 5A shows a schematic of a first type of the first unilateral delay circuit. The first type of the first unilateral delay circuit comprises: N first CMOS inverting delay circuits, N second CMOS inverting delay circuits and an inverter 55, wherein N is an even number. In a first embodiment of the present invention, N is 2.

Each of the first CMOS inverting delay circuits comprises a first PMOS transistor 51 and a plurality of serially coupled first NMOS transistors 52. In an embodiment, there are 4 first NMOS transistors 52 for each of the first CMOS inverting delay circuits. A source of the first PMOS transistor 51 is coupled to a positive power supply, and a gate of the first PMOS transistor 51 is coupled to gates of the 4 first NMOS transistors 52. The 4 first NMOS transistors 52 are serially coupled between a drain of the first PMOS transistor 51 and a negative power supply. The 4 first NMOS transistors 52 are serially coupled in the following way: the drain of the first one of the first NMOS transistors is coupled to the drain of the first PMOS transistor 51, the drains of the other first NMOS transistors 52 are coupled to the corresponding sources of their previous first NMOS transistors 52, and the source of the last one of the first NMOS transistors 52 is coupled to the negative power supply or coupled to the ground. The gate of the first PMOS transistor 51 serves as an input node of the first CMOS inverting delay circuit, and the drain of the first PMOS transistor 51 serves as an output node of the first CMOS inverting delay circuit.

Each of the second CMOS inverting delay circuits comprises a plurality of serially coupled second PMOS transistors 53 and a second NMOS transistor 54. In an embodiment, there are 4 second PMOS transistors 53 for each of the second CMOS inverting delay circuits. A source of the second NMOS transistor 54 is coupled to the negative power supply, a gate of the second NMOS transistor 54 is coupled to the gates of the 4 second PMOS transistors 53. The 4 second PMOS transistors 53 are serially coupled between a drain of the second NMOS transistor 54 and the positive power supply. The 4 second PMOS transistors 53 are serially coupled in the following way: the drain of the first one of the second PMOS transistors is coupled to the drain of the second NMOS transistor 54, the drains of the other second PMOS transistors 53 are coupled to the corresponding sources of their previous second NMOS transistors 54, and the source of the last one of the second PMOS transistors 53 is coupled to the positive power supply. The gate of the second NMOS transistor 54 serves as an input node of the second CMOS inverting delay circuit, and the drain of the second NMOS transistor 54 serves as an output node of the second CMOS inverting delay circuit.

The 2 first CMOS inverting delay circuits and the 2 second CMOS inverting delay circuits are serially coupled between an input signal IN and an input node of the inverter 55 alternately, wherein the input node of the first one of the first CMOS inverting delay circuits is coupled to the input signal IN, the input node of the second one of the first CMOS inverting delay circuits is coupled to the output node of the first one of the second CMOS inverting delay circuit, i.e. the previous one of the second one of the first CMOS inverting delay circuits. The output node of the second one of the second CMOS inverting delay circuits is coupled to the input node of the inverter 55. Each output node of the first CMOS inverting delay circuits is coupled to the input node of the subsequent second CMOS inverting delay circuit. In other words, the output node of the first one of the first CMOS inverting delay circuits is coupled to the input node of the first one of the second CMOS inverting delay circuits, and the output node of the second one of the first CMOS inverting delay circuits are coupled to the input node of the second one of the second CMOS inverting delay circuits. The inverter 55 outputs an output signal OUT0 at its output node.

Figure 5B:
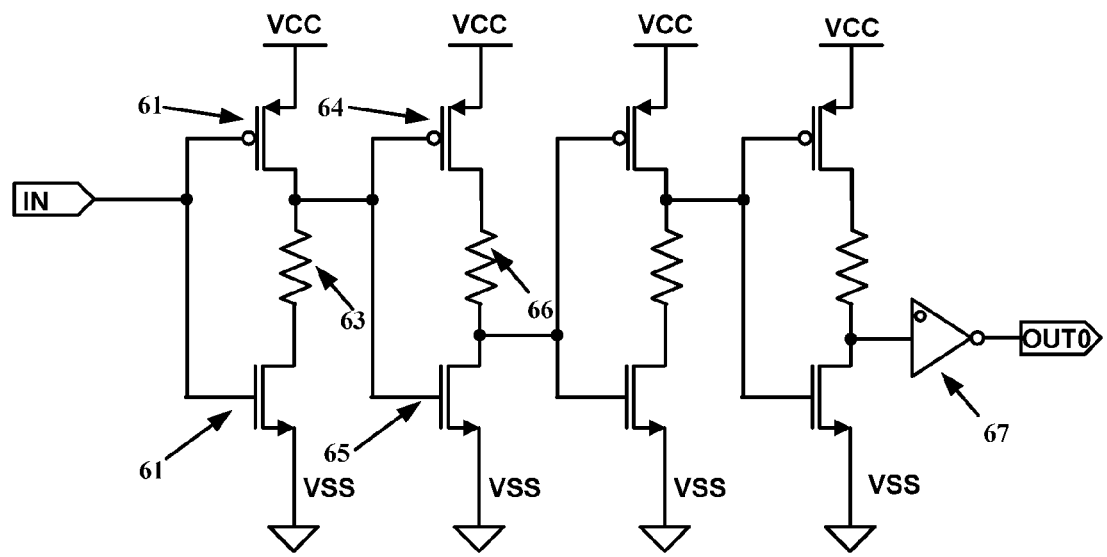
FIG. 5B shows a schematic of a second type of the first unilateral delay circuit according to the first embodiment of the present application.

FIG. 5B shows a schematic of a second type of the first unilateral delay circuit. The second type of the first unilateral delay circuit comprises: N third CMOS inverting delay circuits, N fourth CMOS inverting delay circuits and an inverter 67, wherein N is an even number. In an embodiment of the present invention, N is 2.

Each of the third CMOS inverting delay circuits comprises a third PMOS transistor 61, a third NMOS transistor 62, and a third resistor 63. A source of the third PMOS transistor 61 is coupled to a positive power supply, a gate of the third PMOS transistor 61 is coupled to a gate of the third NMOS transistor 62, and a source of the third NMOS transistor 62 is coupled to a negative power supply. The third resistor 63 is serially coupled between the drains of the third NMOS transistor 62 and the third PMOS transistor 61. The gate of the third PMOS transistor 61 serves as an input node of the third CMOS inverting delay circuit, and the drain of the third PMOS transistor 61 serves as an output node of the third CMOS inverting delay circuit.

Each of the fourth CMOS inverting delay circuits comprises a fourth PMOS transistor 64, a fourth NMOS transistor 65, and a fourth resistor 66. A source of the fourth PMOS transistor 64 is coupled to a positive power supply, a gate of the fourth PMOS transistor 64 is coupled to a gate of the fourth NMOS transistor 65, and a source of the fourth NMOS transistor 65 is coupled to the negative power supply. The fourth resistor 66 is serially coupled between the drains of the fourth NMOS transistor 65 and the fourth PMOS transistor 64. The gate of the fourth NMOS transistor 65 serves as an input node of the fourth CMOS inverting delay circuit, and the drain of the fourth NMOS transistor 65 serves as an output node of the fourth CMOS inverting delay circuit.

The 2 third CMOS inverting delay circuits and the 2 fourth CMOS inverting delay circuits are serially coupled between an input signal IN and an input node of the inverter 67 alternately, wherein the input node of the first one of the third CMOS inverting delay circuits is coupled to the input signal IN, the input node of the second one of the third CMOS inverting delay circuits is coupled to the output node of the first one of the fourth CMOS inverting delay circuit, i.e. the previous one of the second one of the third CMOS inverting delay circuits. The output node of the second one of the fourth CMOS inverting delay circuits is coupled to the input node of the inverter 67. Each output node of the third CMOS inverting delay circuits is coupled to the input node of the subsequent fourth CMOS inverting delay circuit. In other words, the output node of the first one of the third CMOS inverting delay circuits is coupled to the input node of the first one of the fourth CMOS inverting delay circuits, and the output node of the second one of the third CMOS inverting delay circuits are coupled to the input node of the second one of the fourth CMOS inverting delay circuits. The inverter 67 outputs an output signal OUT0 at its output node.

Figure 5C:
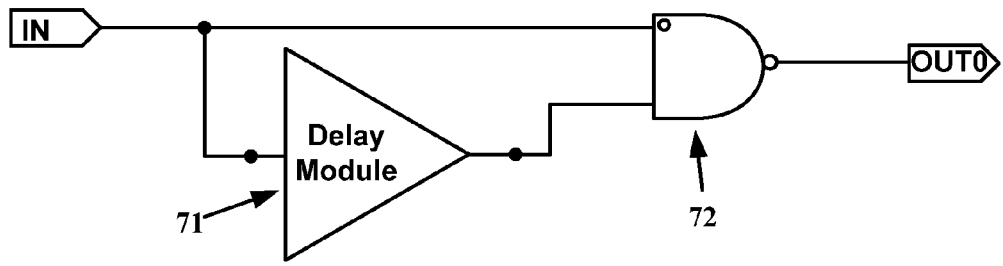
FIG. 5C shows a schematic of a third type of the first unilateral delay circuit according to the first embodiment of the present application.

FIG. 5C shows a schematic of a third type of the first unilateral delay circuit. The third type of the first unilateral delay circuit comprises: a NAND gate 72 and a delay circuit 71. An input node of the delay circuit 71 is coupled to an input signal IN, an output signal of the delay circuit 71 is a delay signal of the input signal IN, which has delays at both the rising edge and the falling edge of the input signal of the delay circuit 71. Two input nodes of the second NAND gate 72 are coupled to the input signal IN and an output node of the delay circuit 71. The second NAND gate 72 outputs an output signal OUT0 at its output node.

Figure 5D:
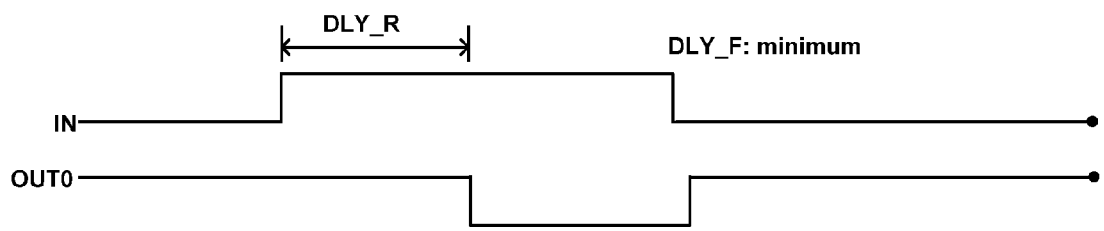
FIG. 5D shows the waveforms of input and output signals of the three types of the first unilateral delay circuit in FIGS. 5A-5C.

FIG. 5D shows the waveforms of the input and output signals of the three types of the first unilateral delay circuit in FIGS. 5A-5C. As shown in FIG. 5D, the output signal OUT0 is a delay signal of the inverting signal of the input signal IN. The output signal OUT0 is delayed for a width DLY_R at the rising edge of the input signal IN, and the delay of the output signal OUT0 at the falling edge of the input signal IN is a minimum eigenvalue.

Figure 6A:
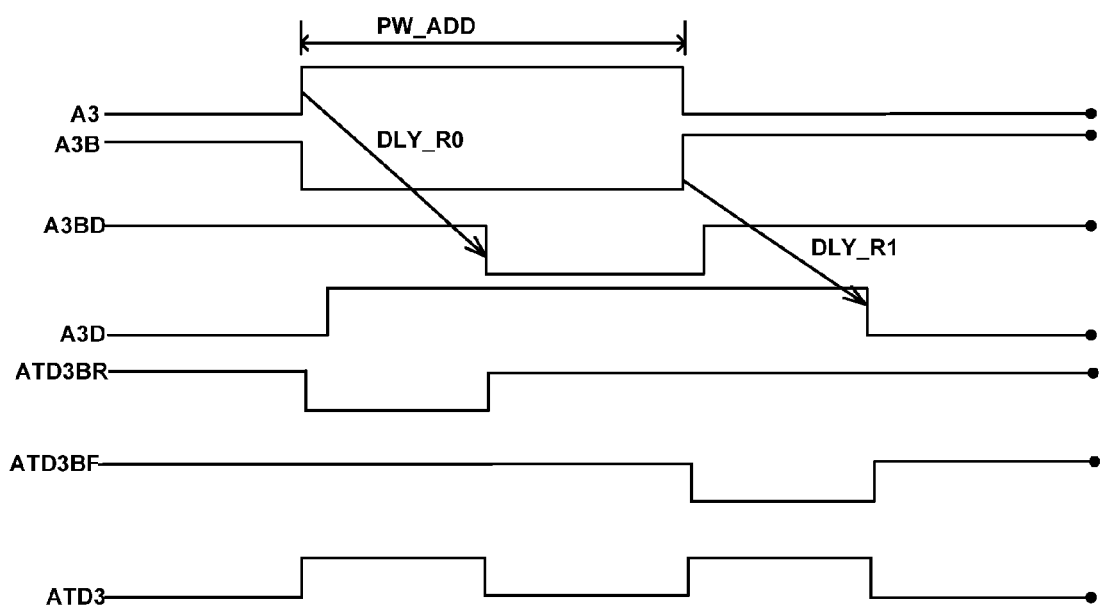
FIG. 6A shows the waveforms of signals of the ATD circuit under normal conditions according to the first embodiment of the present application.

FIG. 6A shows the waveforms of signals of the ATD circuit under normal conditions according to the first embodiment of the present application. As shown in FIG. 6A, the output signal A3BD has a delay having a width DLY_R0 at the rising edge of the address signal A3, and the output signal A3D has a delay having a width DLY_R1 at the rising edge of the inverting signal A3B of the address signal, i.e. at the falling edge of the address signal A3. The normal condition indicates that, an interval PW_ADD of the address signal is bigger than the delay width DLY_R0 or DLY_R1. The address signal A3 and the output signal A3BD generate the first address transition detecting signal ATD3BR having a pulse of a width DLY_R0 at the rising edge of the address signal A3. The inverting signal A3B of the address signal and the output signal A3D generate the second address transition detecting signal ATD3BF having a pulse of a width DLY_R1 at the falling edge of the address signal A3. The first address transition detecting signal ATD3BR and the second address transition detecting signal ATD3BF are combined into the third address transition detecting signal ATD3, which has a pulse of the width DLY_R0 at the rising edge of the address signal A3, and a pulse of the width DLY_R1 at the falling edge of the address signal A3.

Figure 6B:
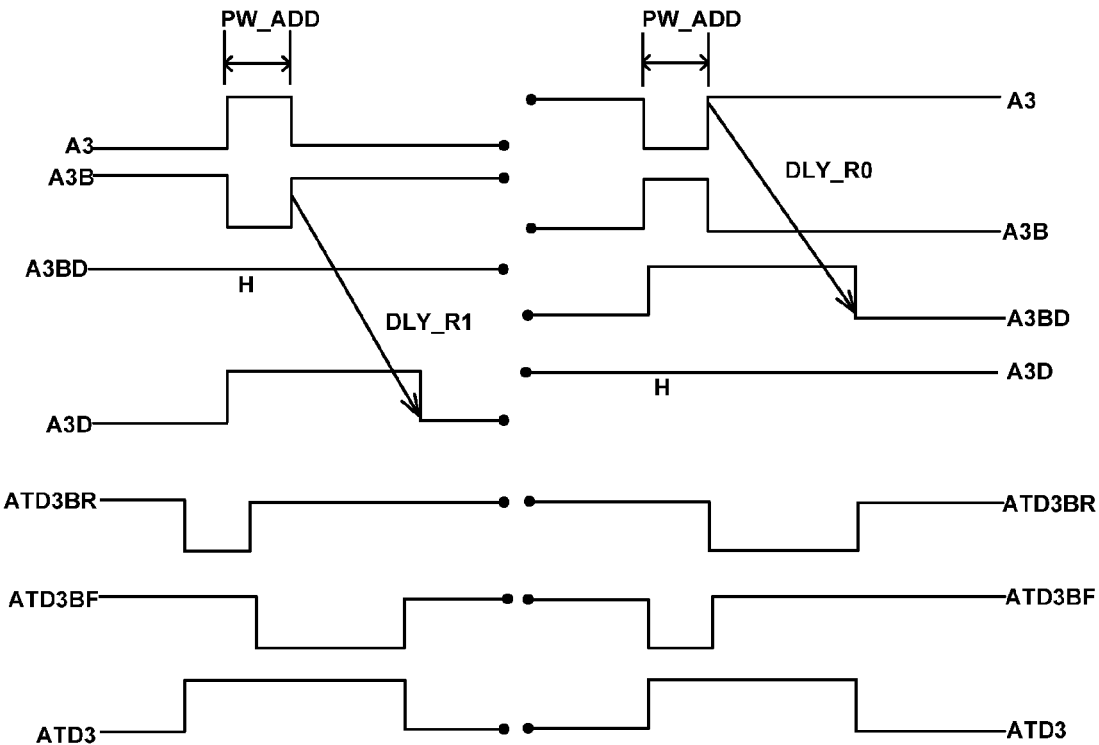
FIG. 6B shows the waveforms of the signals of the ATD circuit according to the first embodiment of the present application when the burrs on the address line make the width of the interval PW_ADD smaller than the width of the DLY_R0 or DLY_R1.

FIG. 6B shows the waveforms of signals of the ATD circuit according to the first embodiment of the present application when the burrs on the address line make the width of the PW_ADD smaller than the width DLY_R0 or DLY_R1. As shown in FIG. 6B, when the address signal A3 is a positive pulse of a width PW_ADD, the first address transition detecting signal ATD3BR having a pulse of the width PW_ADD is generated at the rising edge of the address signal A3, and the second address transition detecting signal ATD3BF having a pulse of the width DLY_R1 is generated at the falling edge of the address signal A3. The first address transition detecting signal ATD3BR and the second address detecting signal ATD3BF are combined into the third address transition detecting signal ATD3 having a pulse of a width PW_AA+DLY_R1.

When the address signal A3 is a negative pulse of a width PW_ADD, the second address transition detecting signal ATD3BF having a pulse of the width PW_ADD is generated at the falling edge of the address signal A3, and the first address transition detecting signal ATD3BR having a pulse of the width DLY_R0 is generated at the rising edge of the address signal A3. The first address transition detecting signal ATD3BR and the second address detecting signal ATD3BF are combined into the third address transition detecting signal ATD3 having a pulse of a width PW_AA+DLY_R0.

Figure 1A:
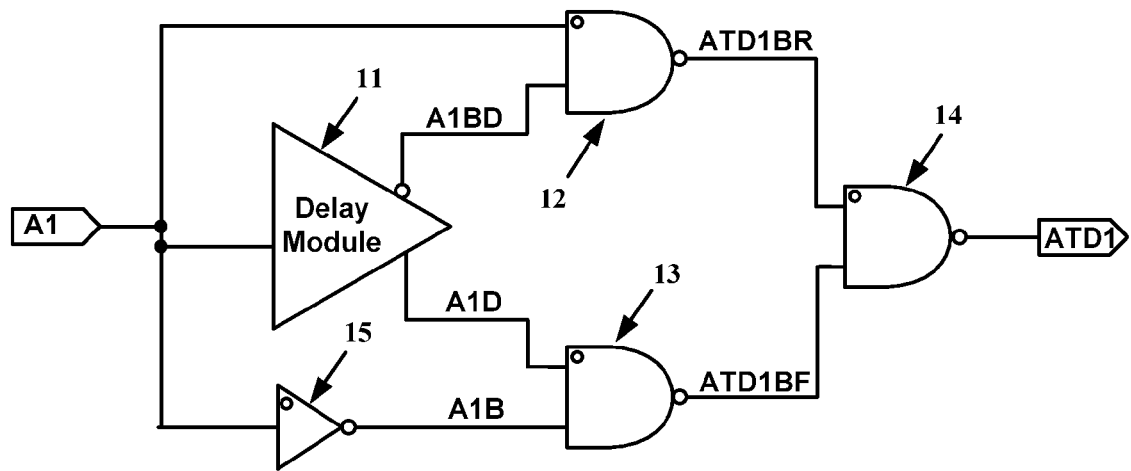
FIG. 1A shows a schematic of a first known ATD circuit.
Figure 1B:
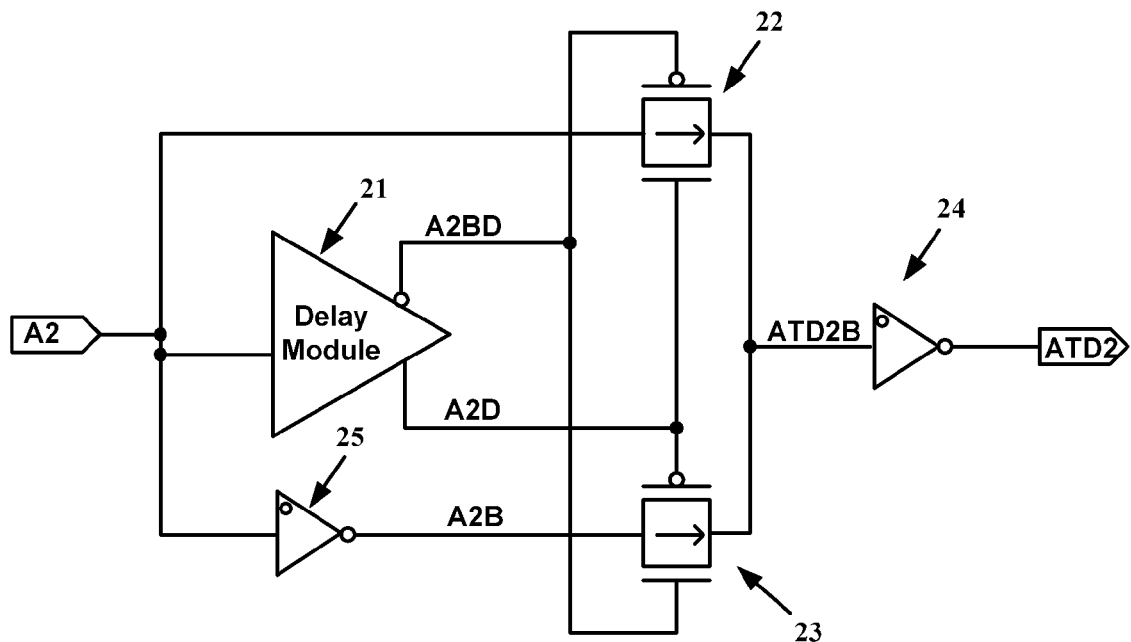
FIG. 1B shows a schematic of a second known ATD circuit.
Figure 2A:
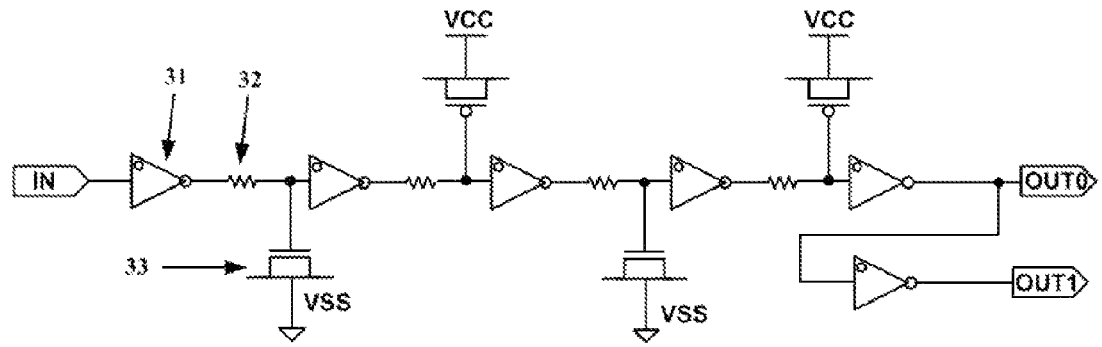
FIG. 2A shows a schematic of a known delay circuit.
Figure 2B:
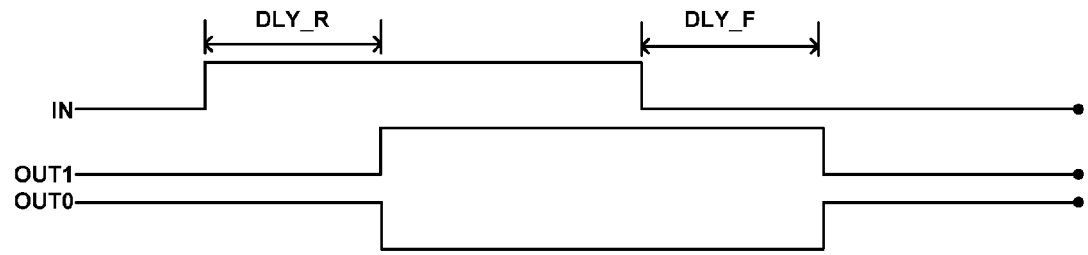
FIG. 2B shows the waveforms of input and output signals of the known delay circuit shown in FIG. 2A.
Figure 3A:
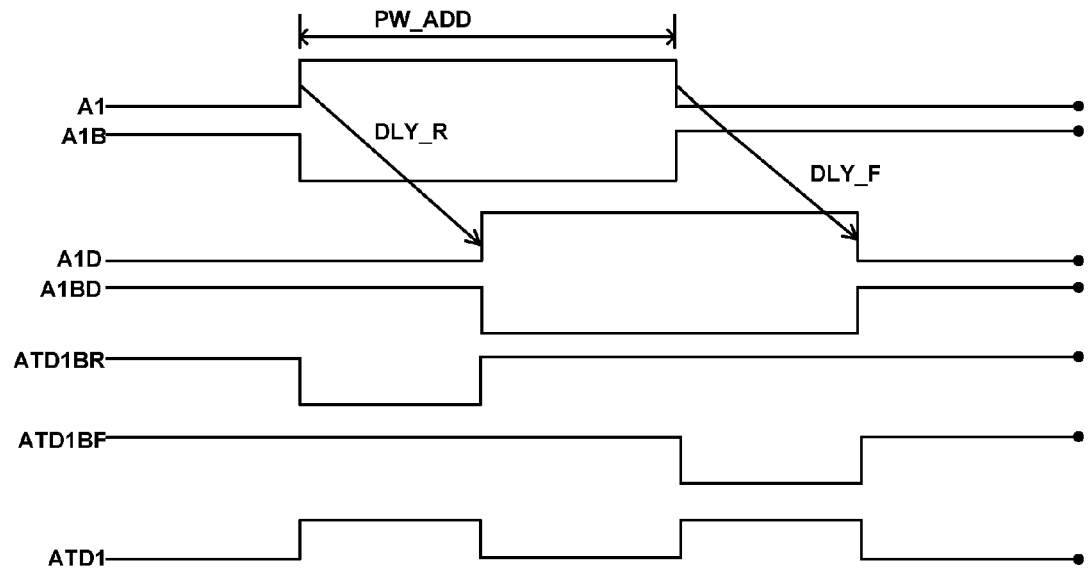
FIG. 3A shows the waveforms of signals of the first known ATD circuit under normal conditions.
Figure 3B:
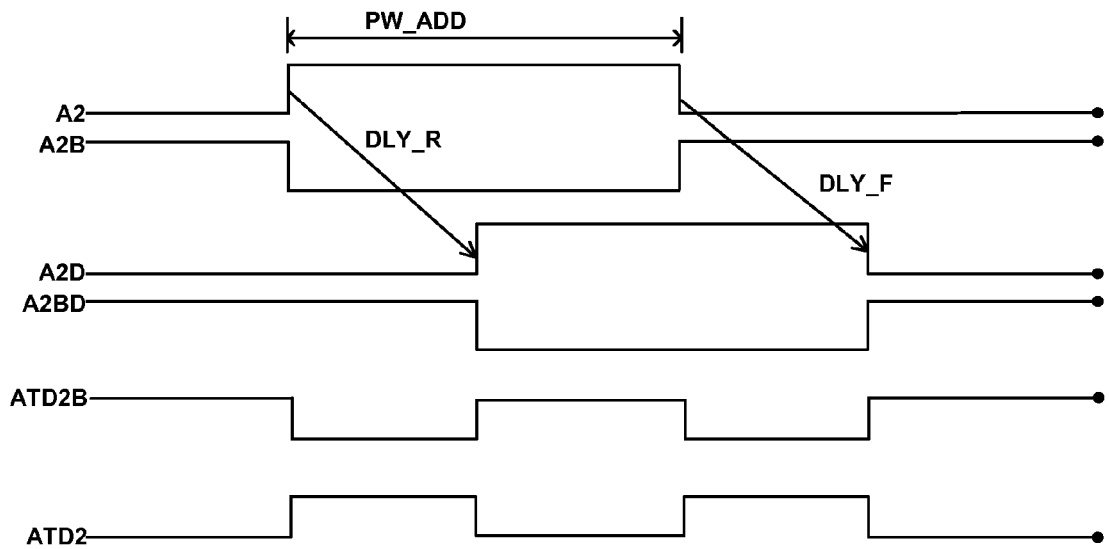
FIG. 3B shows the waveforms of signals of the second known ATD circuit under a normal condition.
Figure 3C:
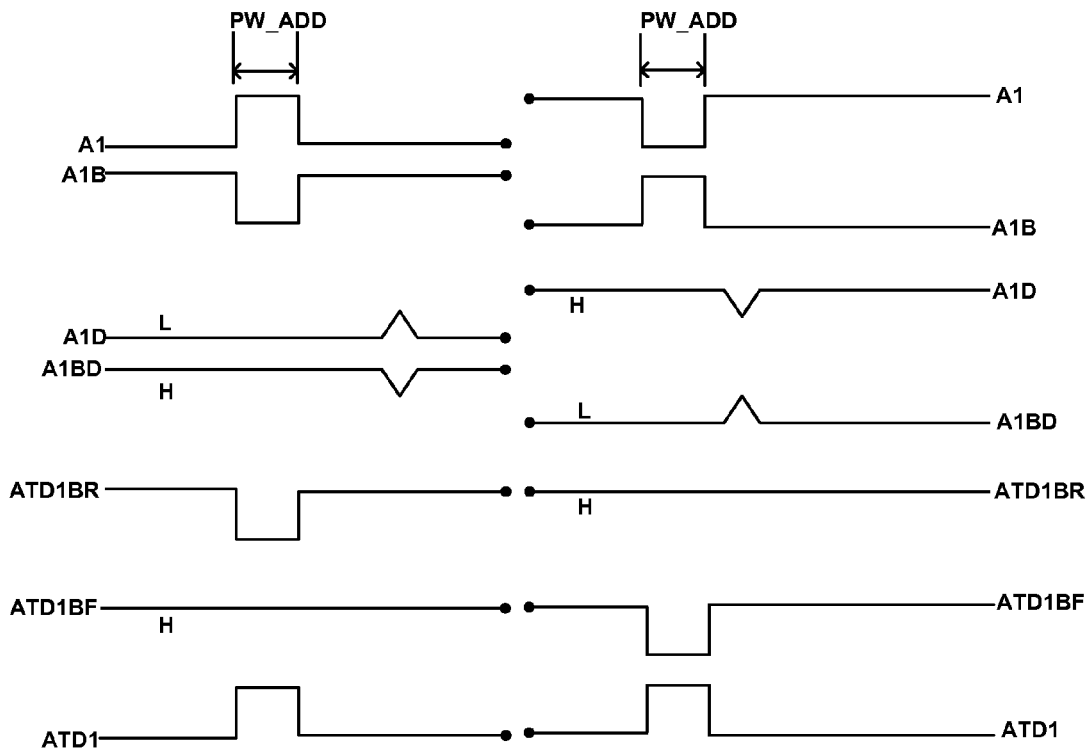
FIG. 3C shows the waveforms of the signals of the first known ATD circuit wherein the burrs on the address line make the width of an interval PW_ADD smaller than the width of the DLY_R or DLY_F.
Figure 3D:
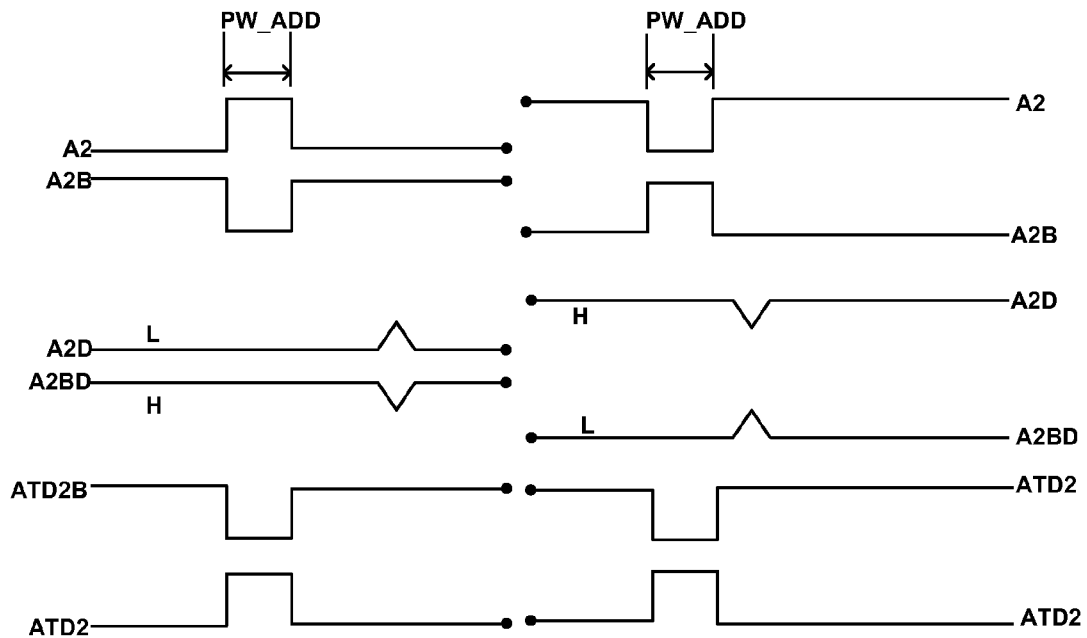
FIG. 3D shows the waveforms of the signals of the second known ATD circuit when the burrs on the address line make the width of the interval PW_ADD smaller than the width of DLY_R or DLY_F.

In the known technologies shown in FIGS. 3C and 3D, when burrs caused by noises appear, the ATD signals, i.e. the pulse signals ATD1 and ATD2, have a same width PW_ADD with the burr signal on the address line. In other words, the ATD signals in the known technologies are under the control of the burr signal. However, in the first embodiment of the present application, the width of the ATD signal, i.e. the third address transition detecting signal ATD3, is PW_ADD+DLY_R0 or PW_ADD+DLY_R1. The signal on the address line finally stabilizes when the last address arrives, thus the width of the ATD signal will not change if it is measured since the address signal finally stabilizes. The waveforms in FIG. 6B shows a burr on the address line. If there exist more burrs, the width of the resulting ATD signal will accumulate. However, the width of the ATD signal will remain DLY_R0 or DLY_R1 when the address signal finally stabilizes.

Figure 7A:
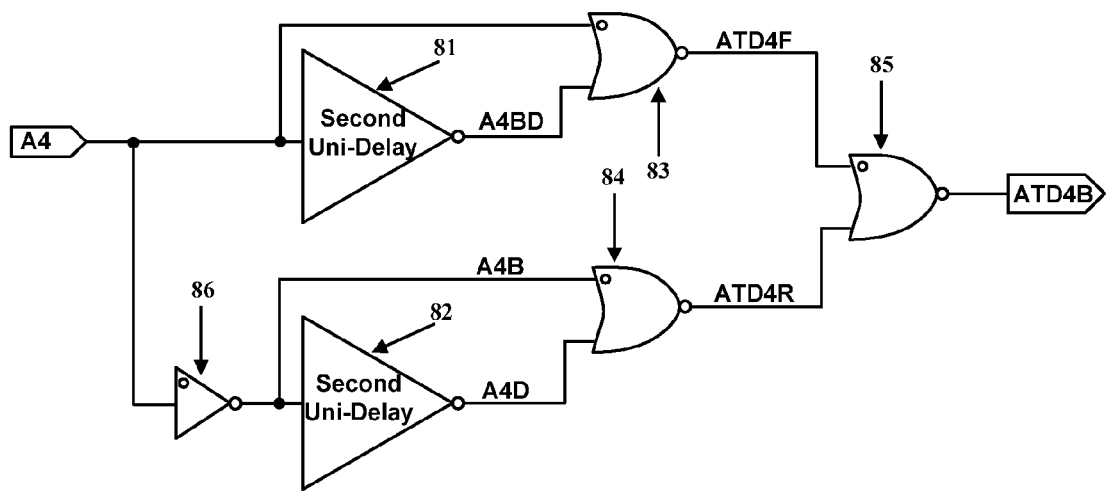
FIG. 7A shows a schematic of an ATD circuit according to a second embodiment of the present application.

FIG. 7A shows a schematic of a second ATD circuit according to a second embodiment of the present application. The address transition detecting circuit according to the second embodiment of the present application comprises a first address transition detecting signal generating module, a second address transition detecting signal generating module, an inverter 86 and a signal combining module comprised of a third NOR gate 85. The first address transition detecting signal generating module is identical to the second address transition detecting signal generating module, wherein the first address transition detecting signal generating module comprises a second unilateral delay circuit 81 and a first NOR gate 83, and the second address transition detecting signal generating module comprises another second unilateral delay circuit 82 and a second NOR gate 84.

An input node of the first address transition detecting signal generating module is coupled to an address signal A4. An input node of the second address transition detecting signal generating module is coupled to an inverting signal A4B of the address signal, the inverting signal A4B is outputted at an output node of the inverter 86, and an input node of the inverter 86 is coupled to the address signal A4.

With respect to the first address transition detecting signal generating module, a first input node of the first NOR gate 83 serves as an input node of the first address transition detecting signal generating module, i.e. coupled to the address signal A4, and the first input node of the first NOR gate 83 is further coupled to an input node of the second unilateral delay circuit 81. A second input node of the first NOR gate 83 is coupled to an output node of the second unilateral delay circuit 81, and an output signal of the second unilateral delay circuit 81 is a signal A4BD. An output node of the first NOR gate 83 serves as an output node of the first address transition detecting signal generating module, i.e. for outputting a first address transition detecting signal ATD4F. The output signal of the second unilateral delay circuit 81, i.e. the signal A4BD, is a delay signal of the inverting signal of the input signal, i.e. the address signal A4; and the output signal A4BD is only delayed at the falling edge of the address signal A4, and the delay of the output signal A4BD at the rising edge of the input signal is a minimum eigenvalue. The first address transition detecting signal generating module generates an output pulse at the falling edge of the address signal A4, and does not generate an output pulse at the rising edge of the address signal A4. The output pulse of the first address transition detecting signal generating module is the first address transition detecting signal ATD4F. The width of the first address transition detecting signal ATD4F is determined by the delay time of the second unilateral delay circuit 81 to the input signal.

With respect to the second address transition detecting signal generating module, a first input node of the second NOR gate 84 serves as an input node of the second address transition detecting signal generating module, i.e. coupled to the inverting signal A4B of the address signal A4, and the first input node of the first NOR gate 84 is further coupled to an input node of the second unilateral delay circuit 82. A second input node of the second NOR gate 84 is coupled to an output node of the second unilateral delay circuit 82, and an output signal of the second unilateral delay circuit 82 is a signal A4D. An output node of the second NOR gate 44 serves as an output node of the second address transition detecting signal generating module, i.e. for outputting a second address transition detecting signal ATD4R. The output signal of the second unilateral delay circuit 82, i.e. the signal A4D, is a delay signal of the inverting signal of the input signal, i.e. the inverting signal A4B of the address signal A4; and the output signal A4D is only delayed at the falling edge of the inverting signal A4B, and a delay of the output signal A4D at the falling edge of the inverting signal A4B is a minimum eigenvalue. In other words, the output signal A4D is only delayed at the rising edge of the address signal A4, and the delay of the output signal A4D at the falling edge of the address signal A4 is the minimum eigenvalue. The second address transition detecting signal generating module generates an output pulse at the rising edge of the address signal A4, and does not generate an output pulse at the falling edge of the address signal A4. The output pulse of the second address transition detecting signal generating module is the second address transition detecting signal ATD4R. The width of the second address transition detecting signal ATD4R is determined by the delay time of the second unilateral delay circuit 82 to the input signal.

The input nodes of the third NOR gate 85 are coupled to the first address transition detecting signal ATD4F and the second address transition detecting signal ATD4R, respectively. The third NOR gate 85 outputs a third address transition detecting signal ATD4B at its output node, which is a combined signal of the first address transition detecting signal ATD4F and the second address transition detecting signal ATD4R. The third address transition detecting signal ATD4B comprises a pulse at the falling edge of the address signal A4 having the same width with the pulse of the first address transition detecting signal ATD4F, and another pulse at the rising edge of the address signal A4 having the same width with the pulse of the second address transition detecting signal ATD4R.

Figure 7B:
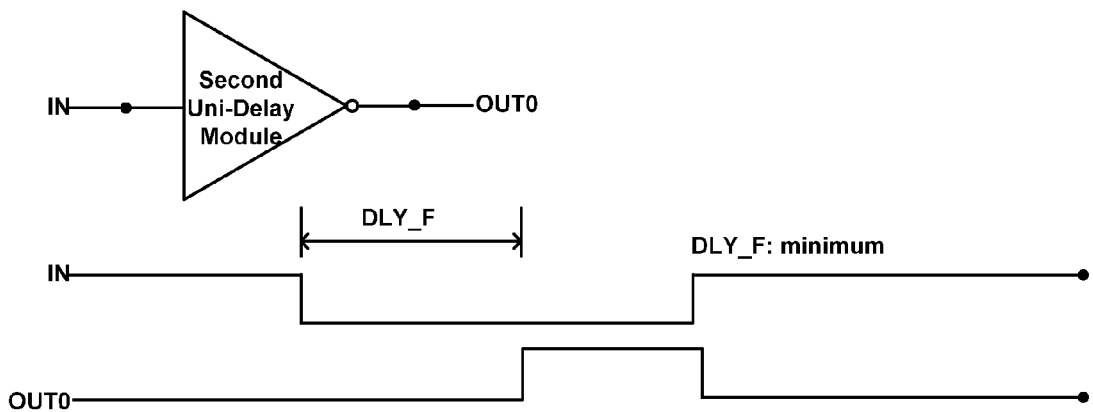
FIG. 7B shows the waveforms of input and output signals of a second unilateral delay circuit according to the second embodiment of the present application.

FIG. 7B shows the waveforms of the input and output signals of the second unilateral delay circuits 81 and 82 according to the second embodiment of the present application. As shown in FIG. 7B, an output signal OUT0 is a delay signal of the inverting signal of an input signal IN. The output signal OUT0 is only delayed at the falling edge of the input signal IN for a width DLY_F, and the delay of the output signal OUT0 at the rising edge of the input signal IN is a minimum eigenvalue.

Figure 7C:
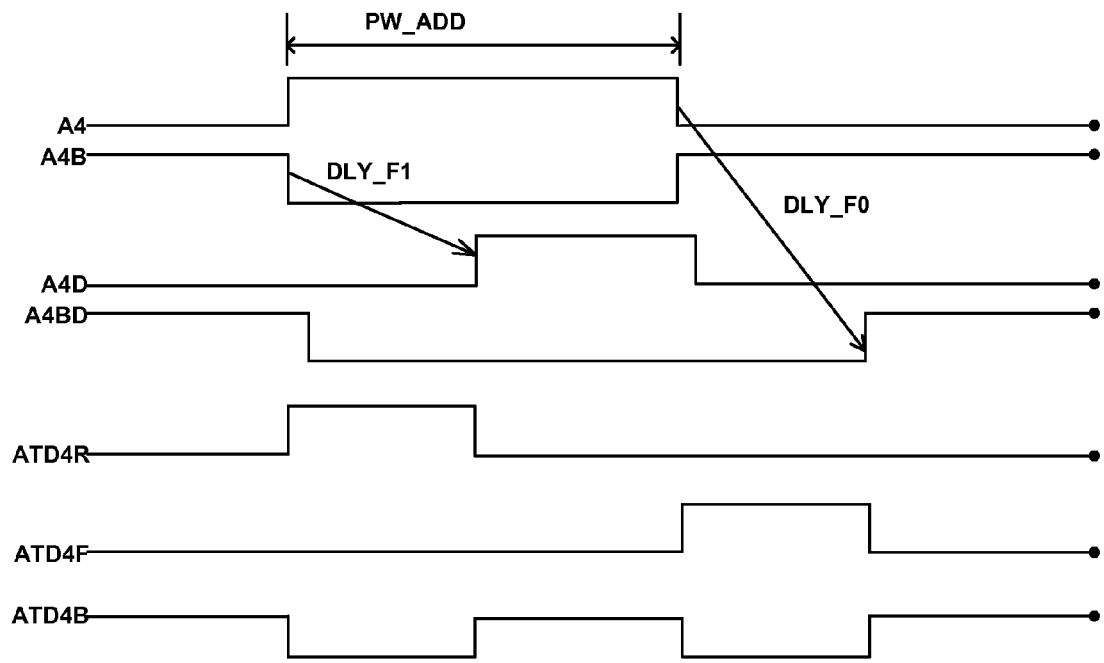
FIG. 7C shows the waveforms of signals of the ATD circuit under normal conditions according to the second embodiment of the present application.

FIG. 7C shows the waveforms of the ATD circuit under a normal condition according to the first embodiment of the present application. As shown in FIG. 7C, the output signal A4BD has a delay having a width DLY_F0 at the falling edge of the address signal A4, and the output signal A4D has a delay having a width DLY_F1 at the rising edge of the inverting signal A4B of the address signal, i.e. at the rising edge of the address signal A4. The normal condition indicates that, an interval PW_ADD of the address signal is bigger than the delay width DLY_F0 or DLY_F1. The address signal A4 and the output signal A4BD generate the first address transition detecting signal ATD4F having a pulse of a width DLY_F0 at the falling edge of the address signal A4. The inverting signal A4B of the address signal and the output signal A4D generate the second address transition detecting signal ATD4R having a pulse of a DLY_F1 at the rising edge of the address signal A4. The first address transition detecting signal ATD4F and the second address transition detecting signal ATD4R are combined into the third address transition detecting signal ATD4B, which has a pulse of the width DLY_F0 at the falling edge of the address signal A4, and a pulse of the width DLY_F1 at the rising edge of the address signal A4.

While the present invention has been described with reference to specific embodiments, which are not intended to be limiting of the present application, it will be apparent to those of ordinary skill in the art that changes or improvements may be made to the disclosed embodiments without departing from the spirit and scope of the present application.

What is claimed is:

1. An address transition detecting circuit, comprising a first address transition detecting signal generating module, a second address transition detecting signal generating module, an inverter and a signal combining module; wherein the first address transition detecting signal generating module is identical to the second address transition detecting signal generating module; an input node of the first address transition detecting signal generating module is coupled to an address signal; an input node of the second address transition detecting signal generating module is coupled to an inverting signal of the address signal, the inverting signal is outputted at an output node of the inverter, and an input node of the inverter is coupled to the address signal;

the first address transition detecting signal generating module and the second address transition detecting signal generating module generate an output pulse at the rising edge of their corresponding input signals, and do not generate the output pulse at the falling edge of their corresponding input signals; or the first address transition detecting signal generating module and the second address transition detecting signal generating module generate the output pulse at the falling edge of their corresponding input signals, and do not generate the output pulse at the rising edge of their corresponding input signals;

input nodes of the signal combining module are coupled to an output node of the first address transition detecting signal generating module and an output node of the second address transition detecting signal generating module, the signal combining module combines the output pulse of the first address transition detecting signal generating module and the output pulse of the second address transition detecting signal generating module and outputs a combined signal, such that the signal combining module generates output pulses at its output node at both the rising edge and the falling edge of the address signal;

wherein both of the first address transition detecting signal generating module and the second address transition detecting signal generating module comprise a first unilateral delay circuit and a NAND gate; a first input node of the NAND gate serves as an input node of the first or second address transition detecting signal generating module, and the first input node of the NAND gate is further coupled to an input node of the first unilateral delay circuit; a second input node of the NAND gate is coupled to an output node of the first unilateral delay circuit; an output node of the NAND gate serves as an output node of the first or second address transition detecting signal generating module;

an output signal of the first unilateral delay circuit is a delay signal of the inverting signal of an input signal of the first unilateral delay circuit; the output signal of the first unilateral delay circuit is only delayed at the rising edge of the input signal of the first unilateral delay circuit, and a delay of the output signal at the falling edge of the input signal of the first unilateral delay circuit is a minimum eigenvalue;

the width of the output pulse at the output node of the NAND gate is determined by the delay time of the first unilateral delay circuit to the input signal of the first unilateral delay circuit;

wherein the first unilateral delay circuit comprises: N first CMOS inverting delay circuits, N second CMOS inverting delay circuits and an inverter, wherein N is an even number;

each of the first CMOS inverting delay circuits comprises a first PMOS transistor and a plurality of serially coupled first NMOS transistors; a source of the first PMOS transistor is coupled to a positive power supply, a gate of the first PMOS transistor is coupled to gates of the plurality of first NMOS transistors, the plurality of first NMOS transistors are serially coupled between a drain of the first PMOS transistor and a negative power supply; the gate of the first PMOS transistor serves as an input node of the first CMOS inverting delay circuit, and the drain of the first PMOS transistor serves as an output node of the first CMOS inverting delay circuit;

each of the second CMOS inverting delay circuits comprises a plurality of serially coupled second PMOS transistors and a second NMOS transistor; a source of the second NMOS transistor is coupled to the negative power supply, a gate of the second NMOS transistor is coupled to gates of the plurality of second PMOS transistors, the plurality of second PMOS transistors are serially coupled between a drain of the second NMOS transistor and the positive power supply; the gate of the second NMOS transistor serves as an input node of the second CMOS inverting delay circuit, and the drain of the second NMOS transistor serves as the output node of the second CMOS inverting delay circuit;

the N first CMOS inverting delay circuits and the N second CMOS inverting delay circuits are serially coupled between the input signal of the first unilateral delay circuit and an input node of the inverter alternately, wherein an input node of the first one of the first CMOS inverting delay circuits is coupled to the input signal of the first unilateral delay circuit, and an output node of the Nth one of the second CMOS inverting delay circuits is coupled to the input node of the inverter, and the inverter outputs an output signal of the first unilateral delay circuit at its output node.

2. The address transition detecting circuit of claim 1, wherein the first unilateral delay circuit comprises a NAND gate and a delay circuit, an input node of the delay circuit is coupled to an input signal of the first unilateral delay circuit, two input nodes of the NAND gate are coupled to the input signal of the first unilateral delay circuit and an output node of the delay circuit, respectively, and the NAND gate outputs an output signal of the first unilateral delay circuit at its output node.

3. The address transition detecting circuit of claim 1, wherein the signal combining module is a NAND gate.

4. The address transition detecting circuit of claim 1, wherein both of the first address transition detecting signal generating module and the second address transition detecting signal generating module comprise a second unilateral delay circuit and a NOR gate; a first input node of the NOR gate serves as an input node of the first or second address transition detecting signal generating module, the first input node of the NOR gate is further coupled to an input node of the second unilateral delay circuit; a second input node of the NOR gate is coupled to an output node of the second unilateral delay circuit, and an output node of the NOR gate serves as an output node of the first or second address transition detecting signal generating module;

an output signal of the second unilateral delay circuit is a delay signal of the inverting signal of the input signal of the second unilateral delay circuit; the output signal of the second unilateral delay circuit is only delayed at the falling edge of the input signal of the second unilateral delay circuit, and a delay of the output signal at the rising edge of the input signal of the second unilateral delay circuit is a minimum eigenvalue;

the width of the output pulse at the output node of the NOR gate is determined by the delay time of the second unilateral delay circuit to the input signal of the second unilateral delay circuit.

5. The address transition detecting circuit of claim 4, wherein the signal combining module is a NOR gate.

6. An address transition detecting circuit, comprising a first address transition detecting signal generating module, a second address transition detecting signal generating module, an inverter and a signal combining module; wherein the first address transition detecting signal generating module is identical to the second address transition detecting signal generating module; an input node of the first address transition detecting signal generating module is coupled to an address signal; an input node of the second address transition detecting signal generating module is coupled to an inverting signal of the address signal, the inverting signal is outputted at an output node of the inverter, and an input node of the inverter is coupled to the address signal;

the first address transition detecting signal generating module and the second address transition detecting signal generating module generate an output pulse at the rising edge of their corresponding input signals, and do not generate the output pulse at the falling edge of their corresponding input signals; or the first address transition detecting signal generating module and the second address transition detecting signal generating module generate the output pulse at the falling edge of their corresponding input signals, and do not generate the output pulse at the rising edge of their corresponding input signals;

input nodes of the signal combining module are coupled to an output node of the first address transition detecting signal generating module and an output node of the second address transition detecting signal generating module, the signal combining module combines the output pulse of the first address transition detecting signal generating module and the output pulse of the second address transition detecting signal generating module and outputs a combined signal, such that the signal combining module generates output pulses at its output node at both the rising edge and the falling edge of the address signal;

wherein both of the first address transition detecting signal generating module and the second address transition detecting signal generating module comprise a first unilateral delay circuit and a NAND gate; a first input node of the NAND gate serves as an input node of the first or second address transition detecting signal generating module, and the first input node of the NAND gate is further coupled to an input node of the first unilateral delay circuit; a second input node of the NAND gate is coupled to an output node of the first unilateral delay circuit; an output node of the NAND gate serves as an output node of the first or second address transition detecting signal generating module;

an output signal of the first unilateral delay circuit is a delay signal of the inverting signal of an input signal of the first unilateral delay circuit; the output signal of the first unilateral delay circuit is only delayed at the rising edge of the input signal of the first unilateral delay circuit, and a delay of the output signal at the falling edge of the input signal of the first unilateral delay circuit is a minimum eigenvalue;

the width of the output pulse at the output node of the NAND gate is determined by the delay time of the first unilateral delay circuit to the input signal of the first unilateral delay circuit;

wherein the first unilateral delay circuit comprises: N third CMOS inverting delay circuits, N fourth CMOS inverting delay circuits and an inverter, wherein N is an even number;

each of the third CMOS inverting delay circuits comprises a third PMOS transistor, a third NMOS transistor and a third resistor; a source of the third PMOS transistor is coupled to a positive power supply, a gate of the third PMOS transistor is coupled to a gate of the third NMOS transistor, a source of the third NMOS transistor is coupled to a negative power supply, and the third resistor is serially coupled between a drain of the third NMOS transistor and a drain of the third PMOS transistor; the gate of the third PMOS transistor serves as an input node of the third CMOS inverting delay circuit, and the drain of the third PMOS transistor serves as an output node of the third CMOS inverting delay circuit;

each of the fourth CMOS inverting delay circuits comprises a fourth PMOS transistor, a fourth NMOS transistor and a fourth resistor; a source of the fourth PMOS transistor is coupled to the positive power supply, a gate of the fourth PMOS transistor is coupled to a gate of the fourth NMOS transistor, a source of the fourth NMOS transistor is coupled to the negative power supply, and the fourth resistor is serially coupled between a drain of the fourth NMOS transistor and a drain of the fourth PMOS transistor; the gate of the fourth NMOS transistor serves as an input node of the fourth CMOS inverting delay circuit, and the drain of the fourth NMOS transistor serves as an output node of the fourth CMOS inverting delay circuit;

the N third CMOS inverting delay circuits and the N fourth CMOS inverting delay circuits are serially coupled between an input signal of the first unilateral delay circuit and an input node of the inverter alternately, wherein an input node of the first one of the third CMOS inverting delay circuits is coupled to the input signal of the first unilateral delay circuit, and an output node of the Nth one of the N fourth CMOS inverting delay circuits is coupled to the input node of the inverter, and the inverter outputs an output signal of the first unilateral delay circuit at its output node.

7. The address transition detecting circuit of claim 6, wherein the first unilateral delay circuit comprises a NAND gate and a delay circuit, an input node of the delay circuit is coupled to an input signal of the first unilateral delay circuit, two input nodes of the NAND gate are coupled to the input signal of the first unilateral delay circuit and an output node of the delay circuit, respectively, and the NAND gate outputs an output signal of the first unilateral delay circuit at its output node.

8. The address transition detecting circuit of claim 6, wherein the signal combining module is a NAND gate.

9. The address transition detecting circuit of claim 6, wherein both of the first address transition detecting signal generating module and the second address transition detecting signal generating module comprise a second unilateral delay circuit and a NOR gate; a first input node of the NOR gate serves as an input node of the first or second address transition detecting signal generating module, the first input node of the NOR gate is further coupled to an input node of the second unilateral delay circuit; a second input node of the NOR gate is coupled to an output node of the second unilateral delay circuit, and an output node of the NOR gate serves as an output node of the first or second address transition detecting signal generating module;

an output signal of the second unilateral delay circuit is a delay signal of the inverting signal of the input signal of the second unilateral delay circuit; the output signal of the second unilateral delay circuit is only delayed at the falling edge of the input signal of the second unilateral delay circuit, and a delay of the output signal at the rising edge of the input signal of the second unilateral delay circuit is a minimum eigenvalue;

the width of the output pulse at the output node of the NOR gate is determined by the delay time of the second unilateral delay circuit to the input signal of the second unilateral delay circuit.

10. The address transition detecting circuit of claim 9, wherein the signal combining module is a NOR gate.

\* \* \* \* \*